United States Patent [19]

Dumoulin et al.

[11] Patent Number: 6,054,858
[45] Date of Patent: Apr. 25, 2000

[54] METHOD TO AUTOMATICALLY TUNE MRI RF COILS

[75] Inventors: Charles Lucien Dumoulin, Ballston Lake; Ronald Dean Watkins, Niskayuna; Icko Eric Timothy Iben, Scotia; Sayed-Amr Ahmes El-Hamamsy; William Alan Edelstein, both of Schenectady, all of N.Y.

[73] Assignee: General Electric Company, Schenectady, N.Y.

[21] Appl. No.: 08/789,114

[22] Filed: Jan. 27, 1997

[51] Int. Cl.[7] ........................................ G01V 3/00
[52] U.S. Cl. ............................. 324/322; 324/314
[58] Field of Search ................... 324/318, 322, 324/319, 320, 321, 314, 307, 309, 300; 600/422

[56] References Cited

U.S. PATENT DOCUMENTS

| | | | |
|---|---|---|---|
| 4,728,894 | 3/1988 | Yoda et al. | 324/318 |
| 4,791,372 | 12/1988 | Kirk et al. | 324/318 |
| 4,890,061 | 12/1989 | Den Boef | 324/320 |
| 4,897,604 | 1/1990 | Carlson et al. | 324/318 |
| 5,143,068 | 9/1992 | Muennemann et al. | 128/653 |
| 5,166,620 | 11/1992 | Panosh | 324/322 |
| 5,278,503 | 1/1994 | Keller et al. | 324/318 |
| 5,357,958 | 10/1994 | Kaufman | 128/653 |
| 5,432,451 | 7/1995 | McGill et al. | 324/322 |
| 5,530,351 | 6/1996 | Moritz et al. | 324/309 |

*Primary Examiner*—Louis Arana
*Attorney, Agent, or Firm*—Jean K. Testa; Donald S. Ingraham

[57] ABSTRACT

A sweep generator 230 applies a range of frequencies to an rf coil 140 to detect the resonant frequency of a field generated by a magnet 125a,b. A frequency to current converter 220 applies an auxiliary magnetic field to tune an MRI apparatus to the resonant frequency of the rf coil. A flexible coil of one turn (300) or two or more turns (500) has a plurality of segments (301–307; 501–513). One of the belt has a contact k0, (k0'), which is electrically connectable to one or more contacts k1, (k1'), k2, (k2'), etc. located between the ends of the segments. For each connection to successive contacts, the length of the coil and its inductance increases by the added impedance $\Delta L_{ij}$ between contacts $k_i$ and $k_j$. That increase of inductance is nullified by capacitors $\Delta C_{sij}$ located between segments.

5 Claims, 6 Drawing Sheets

METHOD TO AUTOMATICALLY TUNE MRI RF COILS

BACKGROUND OF THE INVENTION

1. Field of the Invention

This invention relates in general to magnetic resonance imaging (MRI), and in particular to apparatus and methods for automatically tuning an MRI coil.

2. Description of Related Art

In an MRI process, a sample, such as a human being, is placed in a large magnetic field (the $B_0$ field) that remains constant throughout the MRI process. The magnetic moment of nuclei in the body, in particular nuclei of hydrogen, become aligned with the magnetic field. Next the sample is exposed to an oscillating magnetic field having a selected frequency in the radio frequency (rf) region of the electromagnetic spectrum, causing the nuclei in the sample to resonate. The rf radiation is then switched off, but the nuclei continue to resonate resulting in the emission of rf radiation from the resonating nuclei. The emission is detected as an MRI signal The resonance frequency of the sample depends upon the strength of the large magnetic field. This frequency is called the Larmor frequency and is expressed by the relationship $L=\gamma H$, where L is the Larmor frequency, H is the strength of the magnetic field, $\gamma$ is a constant dependent upon the particular nuclei. The oscillating rf field is generated by an rf coil that encloses the sample. The frequency of the applied oscillating rf field is chosen to be substantially the same as the Larmor frequency.

The rf coil may also be used to receive the resonating emissions from the sample. The inductance and capacitance of the rf coil determine the tuned frequency of the coil and the impedance of the coil. The coil impedance is matched to the optimum source impedance of the preamplifier so that the noise figure of the preamplifier is minimized. The rf coil has its maximum sensitivity for the detecting emitted rf radiation when the inductance and capacitance of the rf coil are chosen so that the rf coil has a tuned frequency which is the same as the Larmor frequency of emitted rf radiation.

Prior art systems have, under certain conditions, had problems tuning the frequency of the rf coil to the Larmor frequency of the nuclei. Since the coil includes reactive elements (coil inductance and capacitive elements) the impedance of the coil is frequency dependent. Coil impedance has real and imaginary components that vary with frequency. Most coils have their impedance tuned and matched t o maximize the signal-to-noise ratio of the detected signal. Often it is sufficient to adjust tuning and matching capacitors upon construction of the rf coil to match the source impedance of the preamplifier which minimizes the preamplifier's noise figure.

For an rf receive coil with a fixed geometry, the signal-to-noise ratio of magnetic resonance signals from a sample increases approximately linearly with the magnetic field. The closer the rf receive coil is to the sample, the larger the signal and the signal-to-noise ratio. Thus, for low fields it is very important that the receive coil be close to the body. The greater the distance between the coil and body, the poorer the MRI image.

The resonance frequency of a coil is determined by the reactive elements of the coil. The subject inside the coil increases it resistance which primarily affects the coil's bandwidth. The closer the coil is to the body, the larger the capacitive coupling to the body and the greater the shift in coil resonance frequency due to variances in the capacitive coupling between the coil and the body. A coil having a variable geometry will have a variable inductance. A chance in coil inductance divided by the nominal coil inductance which is of the order of the Q of the loaded coil will severely detune the coil, resulting in reduced image quality. The resonance frequency of the coil may vary greatly from patient to patient due to changes in coil geometry from patient to patient.

Another factor affecting resonance frequency is variability in the value of the main magnetic field. Superconducting magnets produce high, stable magnetic fields (typically greater than 0.3T). Permanent magnets or conventional electromagnets can produce fields which often vary with time due to temperature variations, resulting in changes in the resonance frequency. Drifts in the magnetic field for a permanent magnet can be of the order of a thousand parts-per-million (PPM) per degree Centigrade resulting in a shift in the Larmor frequency. Such drifts result in the coil being severely detuned with respect to the Larmor frequency of the MRI system, leading to poor signal-to-noise ratios and, hence, poor image quality.

There are a number of techniques for tuning coils to the resonance frequency of the MRI system. See, for example, U.S. Pat. No. 4,897,604 which shows an expandable rf coil composed of a two parts including a main section and a removable bridge segment. Different size bridge segments change both the active and the physical circumference of the coil. In U.S. Pat. No. 5,143,068 a flexible coil having a fixed physical size is tuned by an externally located coupling coil circuit that has variable capacitors $C_s$ and $C_p$. U.S. Pat. No. 4,791,372 also relies upon variable capacitors $C_s$ and $C_p$.

Prior art systems have several limitations. For example, manually retuning an MRI coil for each patient is time-consuming and inefficient. The larger the frequency range over which tuning is required, the greater the time required, the more the difficulty in achieving a match, and thus the greater the cost. Imaging must be delayed until tuning is complete. Such delays add an extra financial burden to health care cost since the time of the patient and the MRI operator are taken up with the tuning process.

In the current art a single coil is not well suited for use with different sized patients because the frequency range for coil tuning and the coil filling factor cannot be made optimal for all patients. Prior art attempts to overcome these limitations with a multiplicity of discrete elements suffer from unreliability due to the number of connectors required between segments and are cumbersome to use since the coil must be reconstructed for each patient. See U.S. Pat. No. 4,897,604. Furthermore, each connection can add a series resistance to the coil due to contact resistance, resulting in a degradation of the coil signal to noise.

OBJECTS OF THE INVENTION

It is an object of this invention to provide an automatically tuned MRI system.

It is a further object to provide a single coil of variable active circumference that is automatically tuned to the sample regardless of the circumference of the coil.

It is a further object to provide a coil of variable circumference that can be easily applied to patients having a variety of sizes.

It is a further object to provide a means of fine tuning the coil with a minimal addition of noise to the coil.

These and other objects of the invention will be understood by those skilled in the art with reference to the following summary and detailed description and the attached drawings.

SUMMARY OF THE INVENTION

In contrast to the prior art, the present invention sets the magnetic field in an Magnetic Resonance Imaging (MRI) system so that the Larmor frequency of the nuclear spins is equal to the tuned frequency of the rf coil. The primary magnetic field of the MRI system is generated by a permanent magnet, an electromagnet or a superconducting magnet. An auxiliary magnetic coil generates an auxiliary magnetic field. The combined primary and auxiliary magnetic fields produce a net magnetic field such that the Larmor frequency of the nuclei being probed are at the tuned frequency of the rf coil.

In a first embodiment of the present invention a sweep generator produces a variable rf frequency signal which is sent to the rf coil via a signal splitting device such as a quadrature hybrid. When the instantaneous frequency of the sweep generator is identical to the tuned frequency of the rf coil, the amount of signal propagated into the rf coil is maximized. Consequently, the amount of signal appearing at a detection port of the signal splitting device will be minimized. A signal measuring means monitors the detection port of the signal splitting device and sends the amplitude of the detected signal to a response frequency identifier means. The response frequency identifier means identifies the frequency of the signal from the sweep generator at the instance of maximum energy transfer into the rf coil. This frequency is the tuned frequency of the rf coil. The frequency measured by the response frequency identifier means is propagated to a frequency converter means which adjusts the strength of the auxiliary magnetic field. The gain of the frequency converter means is selected so that the net magnetic field created by the primary and auxiliary magnets and experienced by the nuclear spins results in the Larmor frequency of the spins being equal to the tuned frequency of the rf coil.

In a second embodiment of the present invention the Larmor frequency of the subject is determined by applying at least one wide-band rf pulse to the subject and detecting the resulting rf emissions. The magnetic field created by the auxiliary magnetic field coils is then changed so that the nuclear spins experience a different net magnetic field. Commensurate with the change in the net magnetic field, the transmitter and receiver frequencies are changed by an amount which is directly proportional to the change of the auxiliary magnetic field so that the detected magnetic resonance signals retain their frequency offsets with respect to the transmitter and receiver frequencies. The strength of the detected magnetic resonance signal is measured at the new net field and is compared to the strength of the magnetic resonance signal prior to the change in the auxiliary field. The entire process is repeated for a series of different net magnetic fields to identify the magnetic field which gives the strongest detected magnetic resonance signal. The strongest detected magnetic resonance signal will be obtained when the Larmor frequency of the nuclear spins is equal to the tuned frequency of the rf coil.

Another embodiment of the invention uses a flexible coil formed as a multi-layer continuous belt. One layer of the coil is made of electrically insulating material. Over the insulating layer is a second layer that includes one or more rf coils for generating or receiving an rf MRI imaging signal. The belt has a minimum physical length and is adjustable in discrete serial active segments to a maximum physical length. The number of connected serial segments determines the active length of the belt. The active length can be less than or equal to the maximum physical length. The minimum length of the belt includes a first active segment that has an inductance and a capacitance. They establish a resonant frequency for the minimum length such that the net reactance is zero. Electrical contacts on one end of the belt are connected to corresponding contacts in the segments to provide means for adjusting the length of the belt to an active length that is an intermediate physical length compatible with the circumference of a sample. Each intermediate length includes one or more active serial segments of the belt that extend from the minimum length to the maximum length. Each serial segment has an incremental inductor and an incremental capacitor that substantially cancel one another so that the resonant frequency of the coil at each intermediate length and at the maximum length is substantially the same as the resonant frequency for the minimum length.

The belt provides an automatic coarse tuning of the rf coil(s) for different size samples. The invention provides further means for fine tuning the rf coil(s) using external controls.

DETAILED DESCRIPTION OF THE INVENTION

1. Tuning Method

Figure 1:
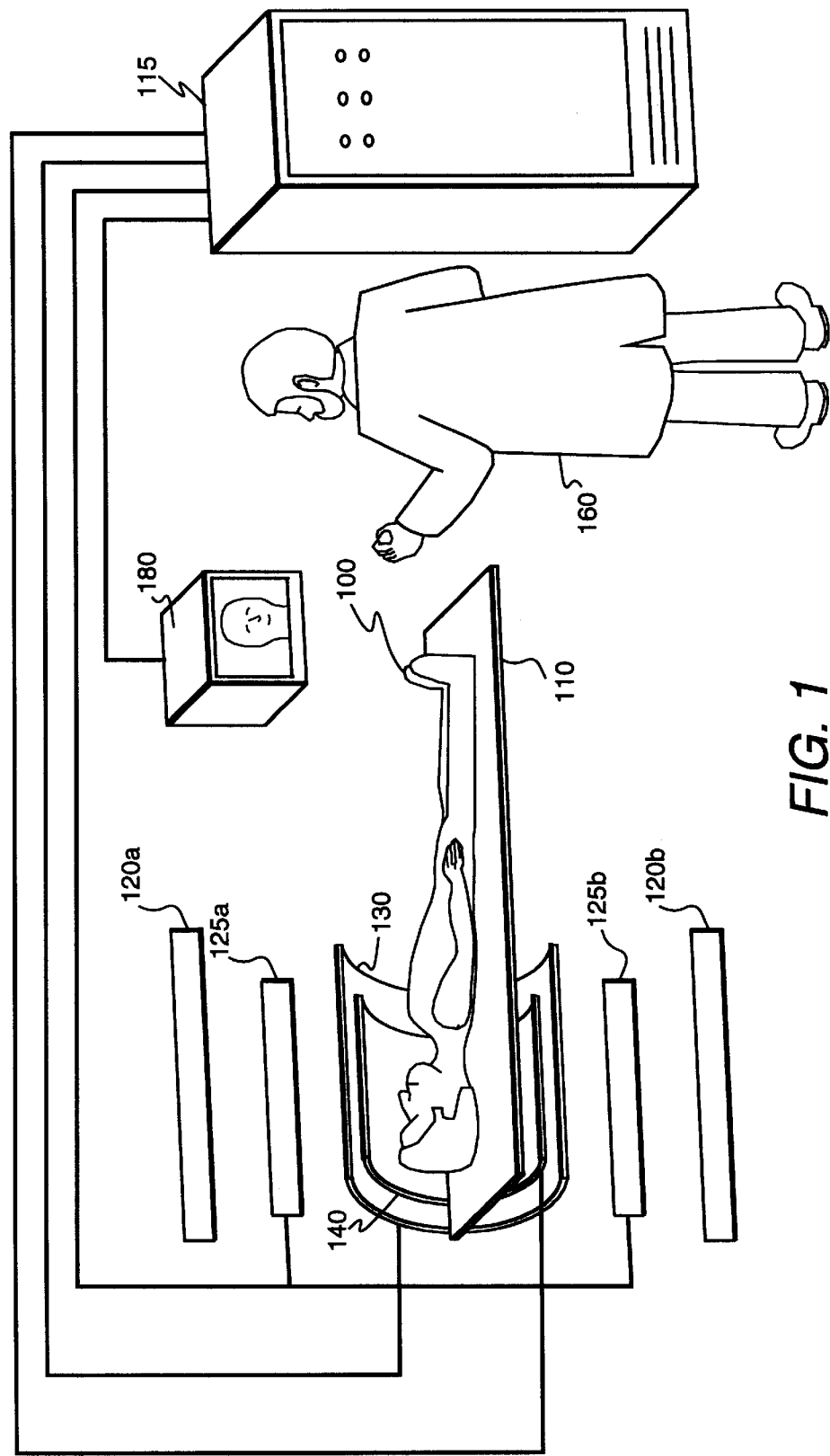
FIG. 1 is a general schematic view of an apparatus used to practice the method of the invention.

Turning to FIG. 1, a subject 100 is placed on a support table 110 and positioned in a homogeneous primary magnetic field generated by primary magnets 120a and 120b and an auxiliary magnetic field generated by auxiliary electromagnets 125a, 125b. In the present embodiment primary magnets 120a, 120b are permanent magnets that establish a field across the subject 100. Other embodiments in which resistive or superconducting magnets are employed are also possible. Auxiliary magnets 125a, 125b generate the auxiliary magnetic field parallel to the primary magnetic field and across the subject 100. A set of magnetic field gradient coils 130 surround subject 100 and create magnetic field gradients of predetermined strength at predetermined times according to predetermined MR pulse sequences. Gradient coils 130 generate magnetic field gradients in three mutually orthogonal directions. At least one external radio-frequency (rf) coil 140 (only one is shown in FIG. 1) also surrounds the region of interest of subject 100. In FIG. 1, gradient coils 130 and rf coil 140 have a cylindrical shape with a diameter sufficient to encompass the entire subject. Other geometries, such as smaller cylinders specifically designed for imaging the head or an extremity, can be used in alternative embodiments. Non-cylindrical gradient and radio-frequency coils, such as surface coils, may also be used.

External rf coil 140 radiates radio-frequency energy into subject 100 at predetermined times and with sufficient power at a predetermined frequency so as to nutate a population of nuclear magnetic spins, hereinafter referred to as "spins", of subject 100 in a fashion well known to those skilled in the art. External rf coil 140 nutates spins by creating a rotating magnetic field which is perpendicular to the primary magnetic field and rotates at the Larmor frequency. If desired, external rf coil 140 can also act as a receiver and detect the MR response signals that are stimulated by nutation. The system is operated under control of the operator 112 and in accordance with a set of instructions stored in a computer contained within an imaging electronics subsystem 115.

The nutation resonates the spins at the Larmor frequency. The Larmor frequency for each spin is directly proportional to the strength of the net magnetic field experienced by the spin. The net field strength is the sum of the static magnetic field generated by primary magnets 120a, 120b and auxiliary magnets 125a, 125b and the local field generated by magnetic field gradient coil 130. For heuristic purposes, the effect of the field gradient coil 130 will be ignored since it remains inactive during tuning of the magnets 120a, 120b and 125a, 125b to the resonant frequency of the rf coil 140. In operation, the gradient coil 130 provides a linearly variable magnetic field that distinguishes the location of rf signals generated at different locations of the subject 100.

Figure 2:
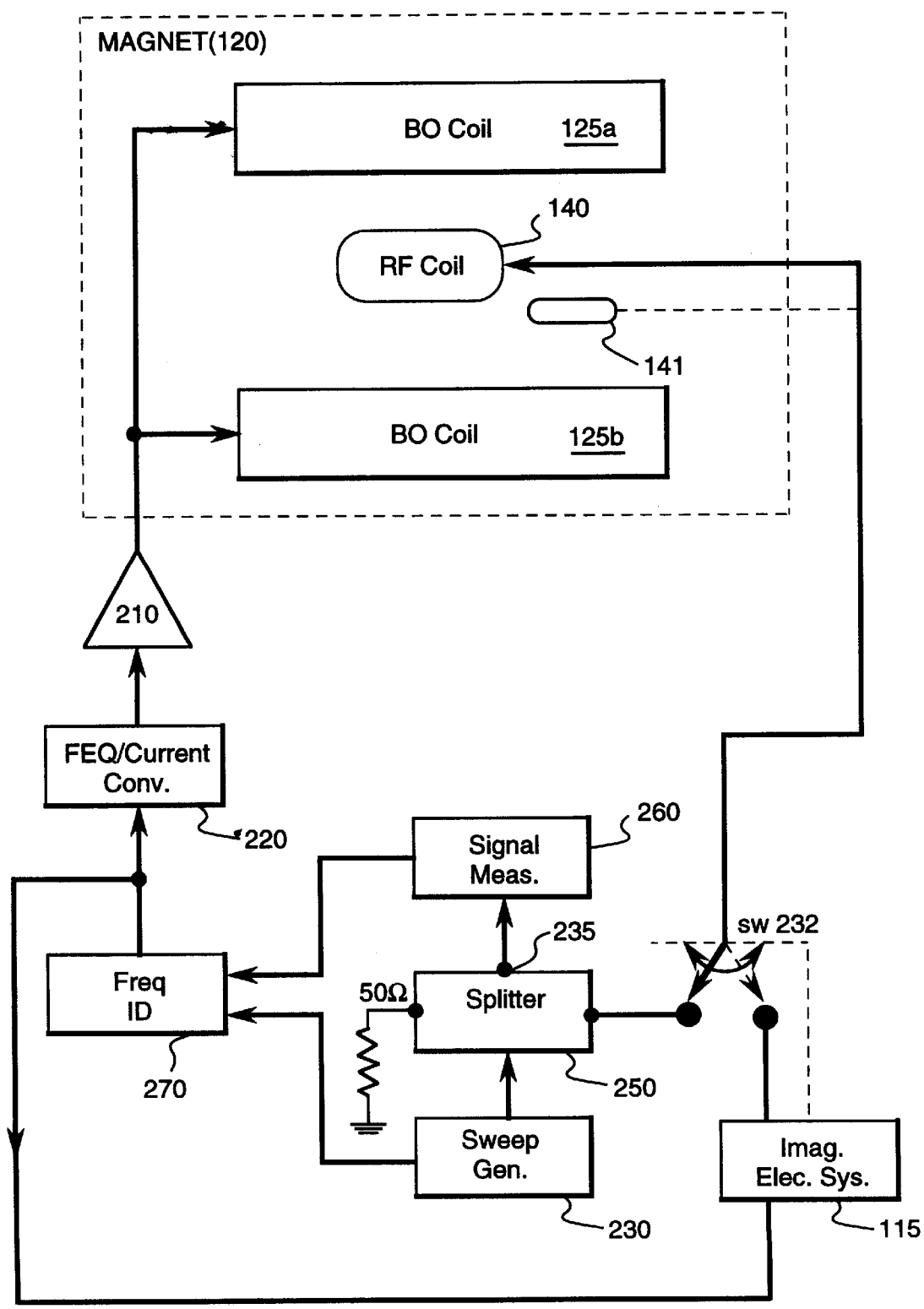
FIG. 2 is a detailed schematic of the components of an MRI apparatus used to practice the invention.

With reference to FIG. 2, a sweep generator 230 produces a variable rf frequency signal which is selectively sent to the rf coil 140 via a signal splitter 250 such as a quadrature hybrid or directional coupler. A switch 232 selectively connects the rf coil 140 to the imaging electronics system 115 or a splitter 250. The switch 232 may be a manual switch or a switch operable by suitable controls in the imaging electronics system 115. Sweep generators are well known in the art. They can be set to any one of a number of frequencies and/or will automatically step an output signal of a fixed peak-to-peak value through a range of frequencies to produce output rf signals of the same amplitude at the different frequencies defined by the chosen range. Quadrature hybrids splitters are also well known to those skilled in the art. Signals sent into a quadrature hybrid splitter exit the splitter through one or more ports. In the present embodiment, if the impedance of the rf coil 140 matches the impedance of the resistor on the opposite port (shown here to be 50 Ohms) then all the signal exits the hybrid via the ports attached to the rf coil 140 and the resistor. Note that the impedance of the rf coil 140 is closest to 50 Ohms at the tuned frequency. Consequently, when the instantaneous frequency of the sweep generator 230 is identical to the tuned frequency of the rf coil 140, the amount of signal propagated into the rf coil is maximized and the amount of signal appearing at the detection port 235 of the signal splitter 250 is minimized. A signal measuring means 260 monitors signals appearing at the detection port of the signal splitting device and sends a signal representative of the amplitude of the detected signal to a response frequency identifier means 270. The response frequency identifier means 270 identifies the frequency of the signal from the sweep generator 230 at the instance of maximum energy transfer into the rf coil 140. This frequency is the tuned frequency of the rf coil 140. The applied current may be amplified by current amplifier 210. The frequency measured by the response frequency identifier means 270 is propagated to a frequency converter means 220 which adjusts the strength of the auxiliary magnetic field by applying an appropriate current to auxiliary magnets 125a, 125b. The gain of the frequency converter means 220 is selected so that the net magnetic field created by the primary and auxiliary magnets and experienced by the nuclear spins results in the Larmor frequency of the spins being equal to the tuned frequency of the rf coil 140. The applied current may be amplified by current amplifier 210. The frequency measured by the response frequency identifier means 270 is also propagated to the imaging electronics subsystem 115 where it is used to set the frequency of the MR system's transmitter and receiver. Once the rf coil 140 is tuned, switch 232 is set to connect rf coil 140 to imaging electronics system 115. The frequency of the rf signal is the resonant frequency that is output by the frequency identifier means 270. In a variation of the first embodiment of the present invention an external probe 141 can be placed near the rf coil 140 to probe the tuning of rf coil 140, instead of employing a direct electrical connection between the rf coil 140 and the sweep generator 230.

In a second embodiment of the present invention the tuned frequency of the rf coil 140 is determined without the use of a sweep generator 230. In the second embodiment, the Larmor frequency of the subject 100 is determined by applying at least one wide-band rf pulse to the subject 100 and detecting the resulting rf emissions with rf coil 140. The magnetic field created by the auxiliary magnetic field coils 125a, 125 is then changed so that the nuclear spins experience a different net magnetic field. Commensurate with the change in the net magnetic field, the transmitter and receiver frequencies of the imaging electronics subsystem 115 are changed by an amount which is directly proportional to the change of the auxiliary magnetic field so that the detected magnetic resonance signals retain their frequency offsets with respect to the transmitter and receiver frequencies. The strength of the detected magnetic resonance signal is measured at the new net field and is compared to the strength of the magnetic resonance signal prior to the change in the auxiliary field. The entire process is repeated for a series of different net magnetic fields to identify the magnetic field which gives the strongest detected magnetic resonance signal. The strongest detected magnetic resonance signal will be obtained when the Larmor frequency of the nuclear spins is equal to the tuned frequency of the rf coil.

Although ideally suited for single rf coils used for both transmit and receive, the first and second embodiments of the present invention may be practiced with multiple rf coils if desired. For example, in an MRI system which has separate transmit and receive rf coils, the present invention can be selectively applied to only the receive coil since proper matching and tuning of a large transmit coil is not critical to image quality whereas matching and tuning a receive coil is critical to image quality. Alternatively, the tuned frequency of the receive and transmit coils can be independently determined and the net magnetic field adjusted for one coil while an automatic or manual adjustment of the tuned frequency of the other coil is made. It should be noted that a mistuned transmit coil requires more rf power whereas a mistuned receive coil degrades the system's signal-to-noise ratio. Also, to avoid or minimize coupling between separate transmit and receive coils, during transmit the receive coil should be dynamically disabled and during receive the transmit coil should be dynamically disabled.

2. Flexible Body Coil

The foregoing tuning method may be used to tune a flexible body coil 300 shown in FIG. 3. The flexible coil 300 has a fixed physical length and an active circumference that is adjustable to accommodate persons of different sizes. Because the inside volume of the coil is almost entirely filled with the patient, the signal pickup from the body is maximized while the pickup of signals external to the body is minimized. Thus the coil signal-to-noise ratio, SNR, approaches the intrinsic limit for pickup from the body.

The active coil length is adjusted by making contact of one end of the coil to other fixed locations along the coil. The coil 300 also has a built-in matching circuit that minimizes the level of external tuning required. While some external tuning may be necessary, the bulk of the tuning required by changes in coil circumference is accomplished mechanically by placing capacitors between the different contact points along the coil's circumference. The values of the capacitors are chosen so their reactance cancels the increase in inductive reactance of the coil on going from one connection to the next. If the coil is tuned to a resonance for the minimum active length, then the coil will automatically be tuned to the same resonance frequency for all of the fixed locations. Fine tuning can then be accomplished by making one of the series capacitors variable.

The flexible body coil 300 is designed to maximize coupling to a wide range of patient sizes, to minimize noise generated by the coil and to minimize the amount of external tuning required to match the coil output impedance to the optimum source impedance of the preamplifier connected to the coil. Because 50 ohm coaxial cables are often used, appropriate reactances are often attached to the preamplifier input in order to make the optimum source impedance of the preamplifier to be 50 ohm with a zero degree phase. For all further discussions, this will be the preferred condition.

Figures 3A, 3B:
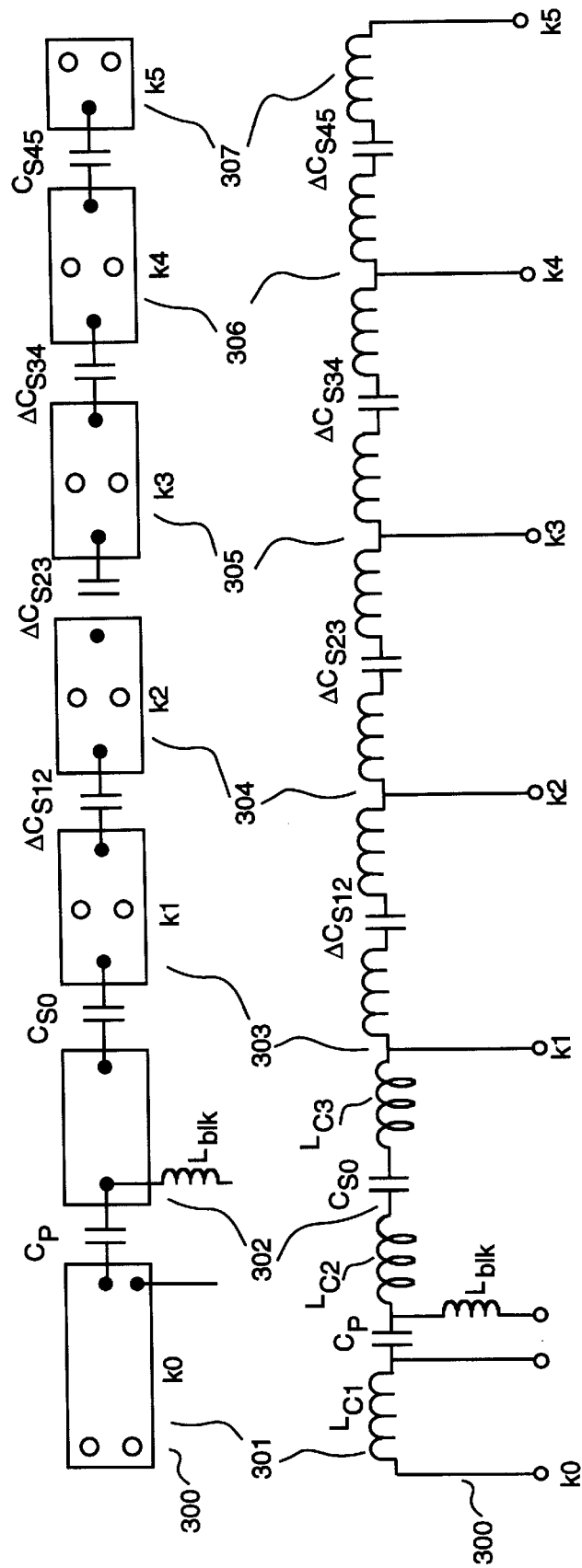
FIG. 3a is a combined mechanical and electrical schematic of the flexible coil.
FIG. 3b is an equivalent electrical circuit of a flexible coil.
Figure 3C:
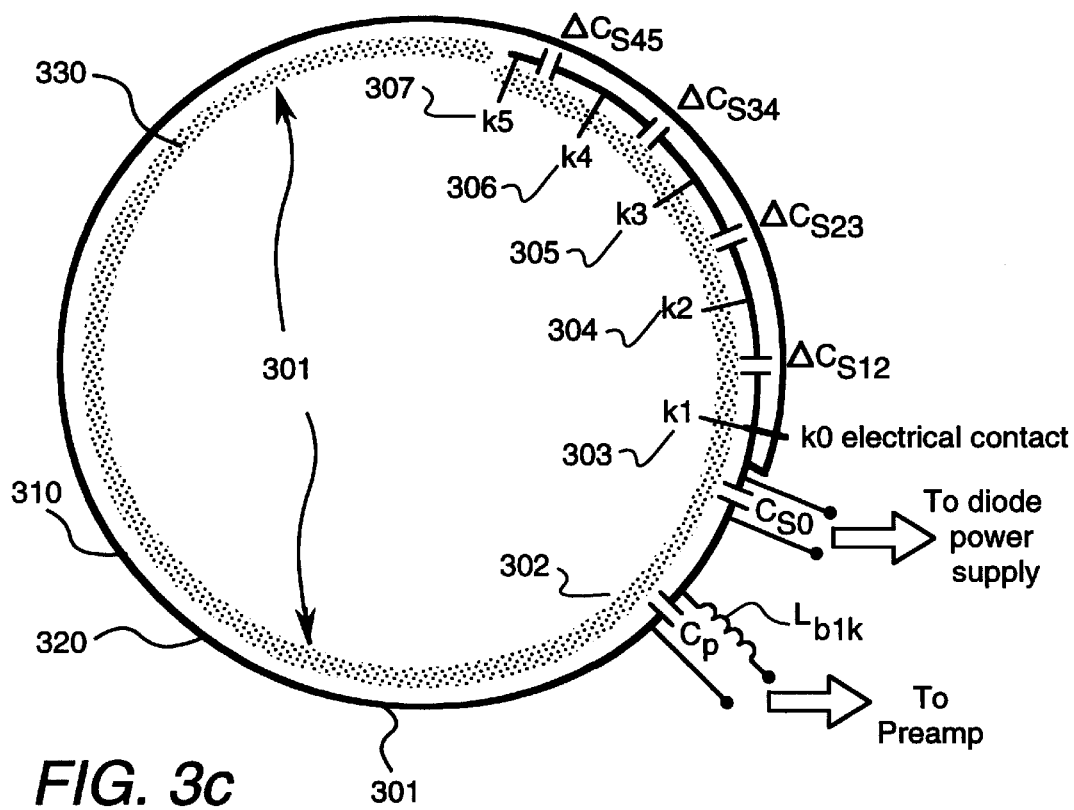
FIG. 3c is an end view of the flexible coil at its minimum active length.

The flexible coil 300 can be wrapped around the patient like a belt and its circumference is adjustable to accommodate different size persons. A diagram of a flexible body coil 300 is shown in FIGS. 3a, 3b, and 3c. FIG. 3a is the disconnected coil; FIG. 3b is the equivalent circuit for the coil of FIG. 3a; FIG. 3c is the configuration of the coil for the minimum active length. The coil 300 has a single turn copper wire strip 310 on a fiberglass insulation sheet 320, and a foam liner 330. The coil 300 could be made with multiple turns about the body. Two capacitors, $C_{s0}$ and $C_p$, are connected in series with the copper wire strip 310 within what is defined as the minimum active length, as shown in FIG. 3c. $C_{s0}$ could be a single capacitor or composed of several capacitors which are connected either in parallel or in series and whose effective combined capacitance equals $C_{s0}$. The coil 300 has a minimal length defined by contact of k0 with k1. When k0 is contacted to k1, the coil has an inductance of $L_{C0}$, (equal to the sum of $L_{C1}$, $L_{C2}$ and $L_{C3}$), and the capacitors $C_p$ and $C_{s0}$ are in series with $L_{C0}$. Segments 301, 302 and part of 303 define the minimal length. A contact point is located at one end of segment 301 (k0') at about the mid-point of segments 303, (k1), 304, (k2), 305, (k3), and 306, (k4), and, at the far end of segment 307 (k5). Each incremental length is defined by adjacent halves of serial segments. The first incremental length is defined by the length from k1 to k2. That first incremental length includes part of segment 304. A capacitor $\Delta C_{s12}$ is chosen to nullify the added reactance from $\Delta L_{12}$ from segments 303 and 304. By choosing capacitance values $\Delta C_{sij}$ whose reactance effectively cancels out the incremental reactance from the incremental inductance $\Delta L_{ij}$, the reactance around the loop of the coil 300 is maintained at effectively the same value for all active lengths. Thus, once the coil is tuned for the minimum active length, the coil will remain tuned for all active lengths of the coil, as seen by making an effective circuit for the coil.

Figure 4:
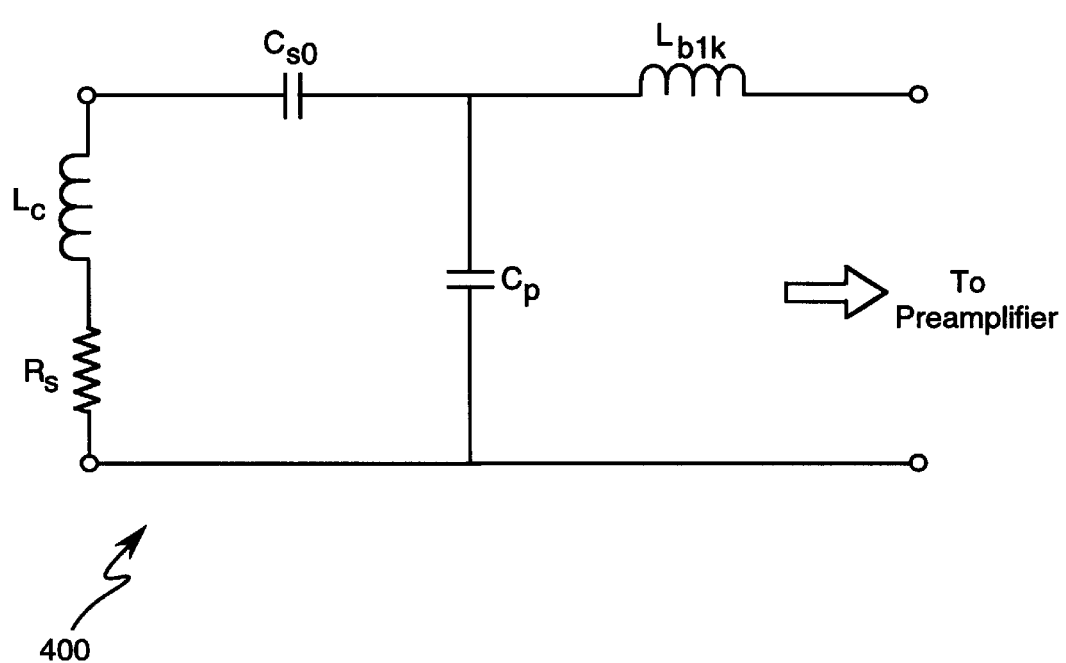
FIG. 4 is an equivalent electrical circuit of the flexible coil.

The coil 300 can be characterized by an effective series LCR circuit, which is diagrammed in FIG. 4. The effective circuit for the resonant body coil is a series inductor, $L_c$, resistor, $R_s$, and capacitors $C_s$ and $C_p$, all in series. $L_c$ is the effective series inductance of the coil, which for the minimum active length in FIG. 3b is the sum of $L_{C1}$, $L_{C2}$ and $L_{C3}$. $R_s$ includes the series resistance of the copper wire strip 310 and the transformed resistance of the subject 100 in the coil 300. $C_s$ is equal to $C_{s0}$ in FIG. 3b. The rf signals are measured across $C_p$ and a series inductor, $L_{blk}$. The impedance, $Z_{in}$, across $C_p$ and $L_{blk}$ of FIG. 4 is given in Equation 1:

$$Z_{in} = jX_{blk} + \frac{-jX_p(R_s + j(X_L - X_s))}{R_s + j(X_L - X_p - X_s)} \tag{1}$$

$$= jX_{blk} + \frac{X_p R_s - jX_p(R_s^2 + (X_L - X_s)(X_L - X_p - X_s))}{(R_s)^2 + (X_L - X_p - X_s)^2}$$

Where $j=\sqrt{-1}$; $X_L$ $(=\omega L_c)$ and $X_{blk}$ $(=\omega L_{blk})$ are the reactance from the coil series inductance, Lc, and the "blocking" inductor, $L_{blk}$; and $X_p$ $(=1/\omega C_p)$ and $X_s$ $(=1/\omega C_s)$ are the capacitive reactance of the parallel, $C_p$, and series, $C_s$, capacitors, and $\omega$ is the radial frequency. The coil resonance frequency, $f_0=\omega_0/2\pi$, is when the series reactance around the coil circumference is zero which occurs when the reactance from the coil inductance, $L_c$, matches the net series capacitive reactance from $C_p$ and $C_s$ as given by Equation 2a. At resonance, the imaginary part of the impedance around the coil circumference $(X_L-X_p-X_s)$ is zero and the real part of the impedance across $C_p$ and $L_{blk}$, $ReZ_{in}(f_0)$, is a maximum as given by Equation 2b. By choosing $L_{blk}$ such that $X_{blk}=X_p$, the imaginary component of the impedance across $C_p$ and $L_{blk}$ is zero.

$$X_L = \omega_0 L_c = X_p + X_s = \frac{1}{\omega_0 C_p} + \frac{1}{\omega_0 C_s} \tag{2a}$$

$$ReZ_{in}(\omega_0) = \frac{X_p^2}{R_s} = \frac{1}{R_s(\omega_0 C_p)^2} \tag{2b}$$

Thus if equations 2a and 2b are satisfied for the minimum active length and for each intermediate active length, the added net reactance is zero and Equations 2a and 2b remain satisfied and unchanged for all contact points.

While nullifying the incremental reactive changes for the different active coil lengths maintains the coil resonance frequency, Equation 2b shows that if the series resistance, $R_S$, changes for different patient sizes, the impedance, $ReZ_{in}(\omega_0)$ will change. In a single turn coil we built for a 0.2T scanner, operating at 8.65 MHz, for persons ranging from 100 lbs and 230 lbs and with waist circumferences between 80 cm and 120 cm, the values of $R_s$ ranged from about 0.2Ω to 1Ω. From Equation 2b, at 8.65 MHz, using a value of about 4.7Ω for $X_p$, the real part of the impedance will therefore be between about 23Ω and 118Ω for all values of $R_s$ measured in this study. For a low noise pre-amplifier whose optimum input impedance is designed to be real and 50Ω, very little additional noise is added for the real input impedances between about one-half and two times this value. Thus it is not necessary to make $C_p$ variable in order to approximate the optimum SNR for different sized patients.

Figure 5:
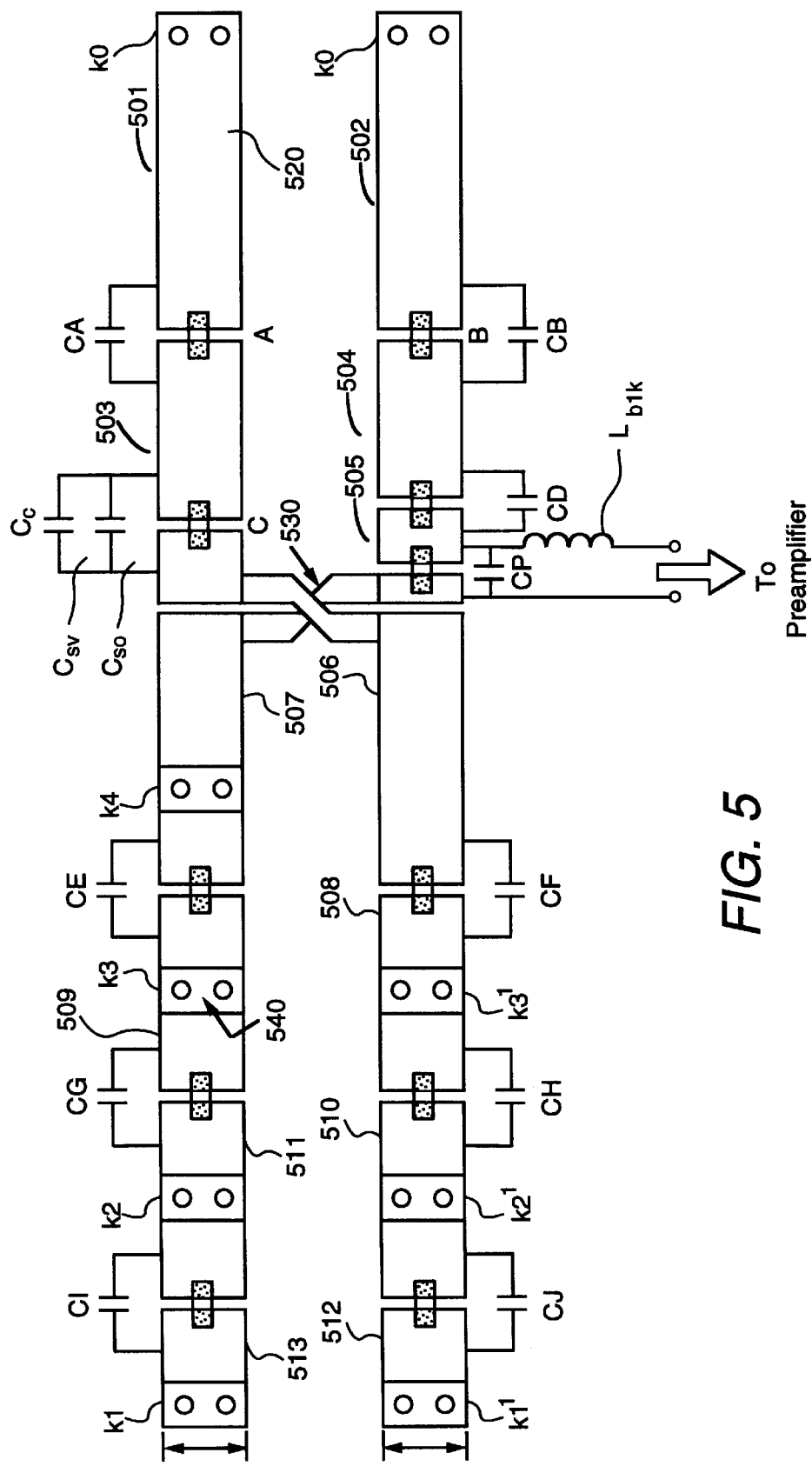
FIG. 5 is a combined mechanical and electrical schematic of the flexible coil with two turns.

The flexible coil may include more than one turn. FIG. 5 shows a double turn solenoid flexible body coil 500. The coil 500 is adjustable with four possible active circumferences (though there is no restriction limiting the number) with automatic coarse-tuning for all four circumferences. The coil 500 has thirteen segments, 501–513, and includes a number of capacitors $C_A$, $C_B$, $C_C$, $C_D$, $C_E$, $C_F$, $C_G$, $C_H$, $C_I$, $C_J$, and $C_P$ located between the segments. Note that capacitor $C_J$ may be a variable capacitor to allow for some external tuning (but here it is shown as a fixed capacitor, $C_{s0}$, in parallel with a variable capacitor, $C_{sv}$). Since there are two turns, two contacts are required for each segment, i.e. k0, k0', k1, k1', etc. The minimum active length is defined by contact of k0 and k0' with k1 and k1' respectively. The first intermediate active length is added by contact of k0 and k0' to k2 and k2' respectively. As with the single turn coil, the mechanical tuning is achieved by making the net change in the coil's reactance substantially zero when moving the contacts of k0 and k0' from k1 and k1' to k2 and k2'. Furthermore, the electrically insulating tape 530 separates the conductive sheets from one another where they overlap. The copper plate 520 is connected to each contact point k0, k0', k1, k1', etc. for added mechanical strength.

Ideally, once a coil has been tuned for a single patient for the minimum active length of the coil, when the net reactance between connections has been tuned substantially to zero, no further tuning would be required for increases in the active coil length. In practice, variability in the coil's resonance frequency associated with changes in the coil's inductance due to slight geometrical differences between patients and to slight changes in the mutual inductance coupling between the coil and the magnet system results in a variability in the coil's resonance frequency from patient to patient. For this reason, fine tuning may be required for clinical applications. We have devised three externally controlled tuning methods. One tuning method involves tuning the main magnetic field as described in the previous section on Tuning. The second tuning method involves externally fine tuning the reactance of the active length of the coil to adjust the resonance frequency of the coil. The third tuning method involves externally tuning the reactive component of the coil's impedance to match the phase of the source impedance into the preamplifier to zero. In general the impedance of the flexible coil and any coaxial cable and connectors, as seen from a preamplifier, is ideally the same as the preamplifier source impedance but may be in a range of about one half to twice the source impedance.

Externally tuning the reactance of the active component of the coil to adjust the resonance frequency of the coil can be accomplished by placing a variable reactance in parallel or in series with capacitor $C_{s0}$. One such variable reactive element is a variable capacitor, $C_{sv}$. To maximize the signal-to-noise ratio of the coil, high Q variable reactive elements are required. Two examples of high Q voltage controlled variable capacitors are: ultra-abrupt diode capacitors as a continuously variable capacitor or switched capacitors using PIN diodes for digital capacitance variability. One possible placement of the switched capacitor unit is to connect the switched capacitors in parallel with capacitor $C_{s0}$ in FIG. 4. In FIG. 5. the switched capacitors are represented by $C_{sv}$.

Figure 6A:
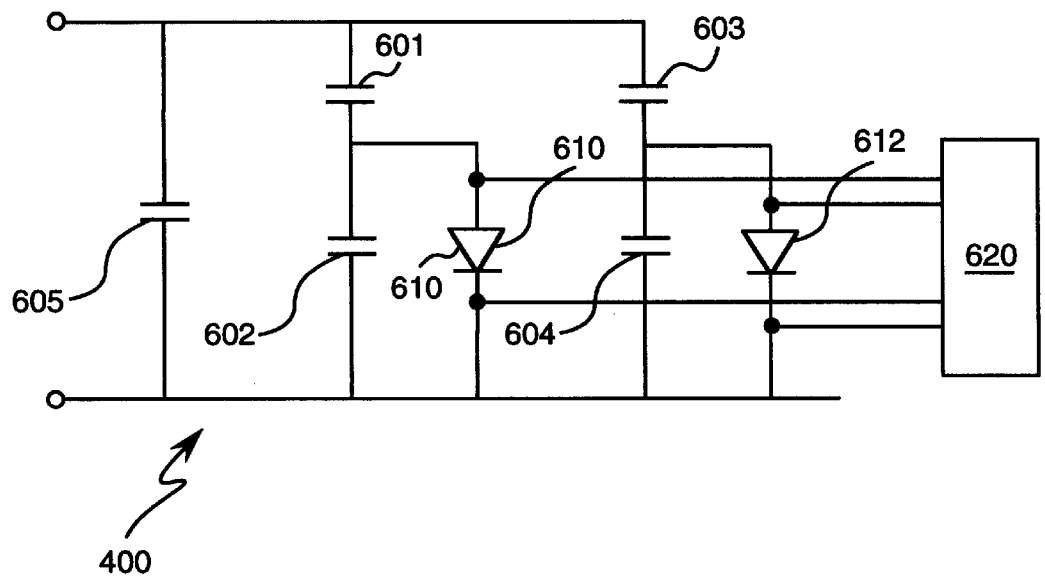
FIG. 6a is a switched capacitor tuning circuit for the flexible coil of FIG. 3 and FIG. 5.

FIG. 6a shows an example the switched capacitor tuning circuit 600 containing two switched capacitors used to tune the flexible body coil 300 or coil 500. More switched capacitors may be used to achieve a wider range of tuning, increased resolution, or both. The capacitors 601 and 602 are connected in series and the capacitors 603 and 604 are connected in series. The capacitors 601–602 and 603–604 of the switched capacitor unit are connected in parallel with another capacitor 605, which could also be $C_{s0}$ of FIG. 4 and FIG. 5. Diodes 610 and 612 are respectively connected in parallel with capacitors 602 and 604. The diodes 610, 612 are controlled by diode control circuit 620. The diode control circuit contains reactive elements, such as inductors and capacitors, to electrically isolate the coil from the external world at the operating frequencies of the coil. Each diode 610, 612 is either forward biased or reverse biased in accordance with a control voltage applied to the diode by control circuit 620. So, the diodes 610, 612 switch capacitors 602, 604, respectively, either into or out of the tuning circuit 600. With the two diodes 610, 612 the resonance frequency of the coil can be tuned to four possible values with the bias of the diodes 610, 612 being: forward, forward; forward, reverse; reverse, forward; reverse, reverse. PIN diodes are an excellent choice of switches because of their low forward biased resistance, which currently can be as low about $0.25\Omega$ at 8.65 MHz. For fine tuning of the series capacitance of the coil's active length, the capacitance values of capacitors 601–604 are much smaller than that of capacitor 605. Furthermore, in order to minimize additional series resistance of the coil when the PIN diodes are forward biased, the reactance of diodes 601 and 603 should be much larger than the series resistance of the forward biased PIN diodes. Making the capacitance value of capacitor 605 much larger than the values of capacitors 601–604 also helps to reduce the addition to the total effective series resistance of the coil, $R_s$, due to the presence in the circuit of the diodes 610, 612.

Figure 6B:
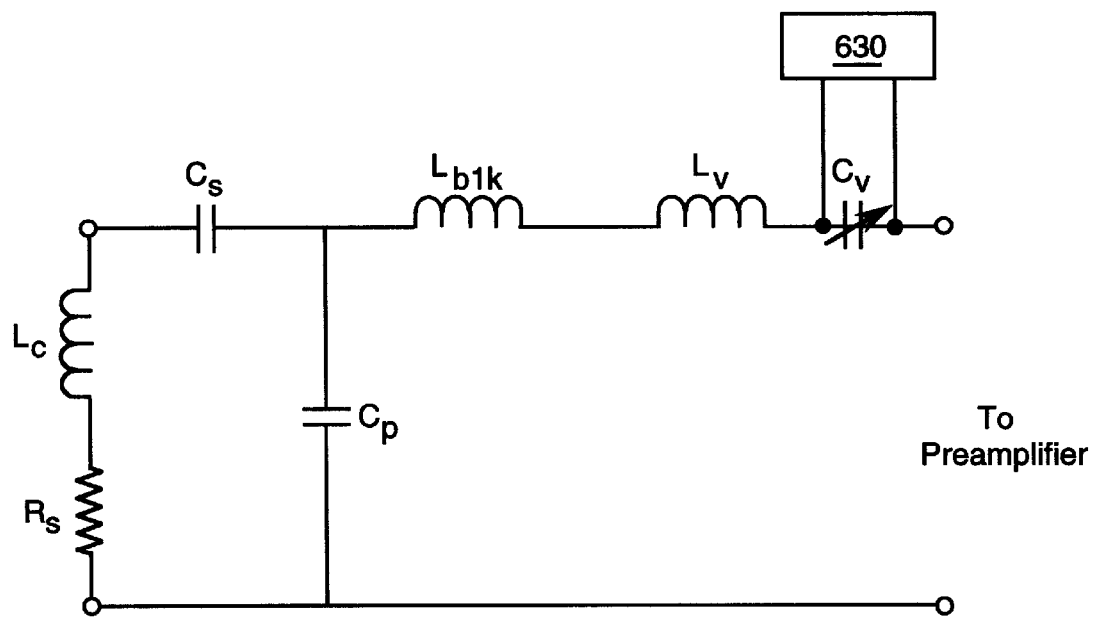
FIG. 6b is an equivalent electrical circuit of the flexible coil of FIG. 3 and FIG. 5 with a phase tuning circuit.

Phase tuning can be performed between the coil output and the preamplifier. FIG. 6b shows a phase tuning circuit placed immediately after the coil. The phase seen by the pre-amplifier can be brought to zero by the addition of the appropriate reactive elements placed in series with the coil's output, transforming the imaginary component of the coil's output impedance to zero with little affect on the real component of the impedance. While phase tuning can be done with either a variable inductor or a variable capacitor, FIG. 6b depicts the variable element to be a capacitor. The phase tuning elements shown in FIG. 6b are composed of a fixed inductor, $L_v$, and a variable capacitor, $C_v$. The variable capacitor is connected to a capacitance controlling device 630. For an ultra-abrupt diode variable capacitor, the capacitance would be a voltage controlling device with appropriate electronics. For example, for the coil tuned at resonance to $100\Omega$ phase tuning over the range of ±45 degrees, the reactance of the inductor and capacitor must respectively be equal to $50\Omega$ and $100\Omega$ which at 8.64 MHz correspond to an inductance, $L_v$, of 0.92 $\mu$h and a capacitance, $C_v$ of 184 pf. Hyper abrupt diodes are an excellent, high Q choice for a variable capacitor, $C_v$, since they can be tuned over a large fraction of their nominal values and have low series resistances. Switch capacitors could also be used to digitally vary $C_v$.

While several presently preferred embodiments of the novel automatic tuning method have been described in detail herein, many modifications and variations will now become apparent to those skilled in the art. It is, therefore, to be understood that the appended claims are intended to cover all such modifications and variations as fall within the true spirit of the invention.

What we claim is:

1. In a magnetic resonance imaging apparatus having a primary coil for generating a primary magnetic field in a first direction, an auxiliary coil for generating an auxiliary magnetic field in a direction parallel to the primary magnetic field and resulting in a net magnetic field in a first direction and an rf coil for transmitting and receiving an rf signal that generates an imaging signal in a direction substantially perpendicular to the direction of the net magnetic field, a method for tuning the apparatus to the resonant frequency of the rf coil comprising the steps of:

placing a sample within the primary coil, auxiliary coil and rf coil of the magnetic resonance imaging apparatus and causing the nuclear spins of the sample to resonate at a Larmor frequency proportional to the net magnetic field;

applying radio frequency signals of one or more frequencies to the rf coil;

monitoring the transfer of energy into the rf coil in response to the applied radio frequency signals;

identifying the frequency at which energy transfer into the rf coil is maximized;

varying the magnitude of the current applied to the auxiliary coil to change the net magnetic field so that the Larmor frequency of the sample is substantially the same as the identified frequency at which energy transfer into the rf coil is maximized.

2. The method of claim 1 wherein the frequency of the radio signals applied to the rf coil are swept over a range of radio frequencies to identify the resonance frequency.

3. In a magnetic resonance imaging apparatus having a primary coil for generating a primary magnetic field in a first direction, an auxiliary coil for generating an auxiliary magnetic field in a direction parallel to the primary magnetic field and resulting in a net magnetic field in a first direction, an rf coil for transmitting and receiving an rf signal that generates an imaging signal in a direction substantially perpendicular to the direction of the net magnetic field, a transmitter for sending rf pulses to the rf coil, and a receiver to detect magnetic resonance response signals from the rf coil, a method for tuning the apparatus to the resonant frequency of the rf coil comprising the steps of:

a) placing a sample within the primary coil, auxiliary coil and rf coil of the magnetic resonance imaging apparatus and causing the nuclear spins of the sample to resonate at a Larmor frequency proportional to the net magnetic field;

b) selecting a transmitter and receiver frequency which has a selected offset from the Larmor frequency of the sample;

c) applying at least one rf pulse at the selected transmitter frequency to the rf coil to nutate nuclear spins within the sample;

d) detecting rf signals in response to the applied rf pulse;

e) measuring the amplitude of the detected rf signal;

f) varying the magnitude of the current applied to the auxiliary coil by a selected amount to change the net magnetic field of the apparatus;

g) varying the frequency of the receiver and transmitter of the apparatus by an amount proportional to the selected change in current applied to the auxiliary coil so that the detected rf signal has an offset frequency substantially identical to that selected in step b;

h) repeating steps c–g a selected one or more times to determine the auxiliary coil current which gives the largest amplitude of the detected rf signal;

i) setting the current in the auxiliary coils of the apparatus to the current found to give the largest amplitude detected rf signal in step h.

4. A tunable magnetic resonance imaging apparatus comprising:

a primary coil for generating a stationary magnetic field in a first direction;

an auxiliary coil for generating an auxiliary magnetic field in said first direction thereby generating a net magnetic field in said first direction and establishing a resonant frequency in a sample in the net magnetic field that is proportional to the strength of a net magnetic field;

an rf coil for transmitting and receiving an rf signal that generates a second magnetic field in a second direction substantially perpendicular to the first magnetic field;

signal splitting means for splitting a sweep generator signal between two output ports including one output port selectively connectable to the rf coil;

a sweep generator coupled to the signal splitting means for generating rf signals of different frequencies;

a signal measuring means coupled to the signal splitting means for detecting the amount of rf signal which is propagated from the sweep generator through the signal splitting means to the rf coil and for generating an output signal proportional to the magnitude of the detected rf signal;

a response frequency identifier means coupled to the sweep generator and to the signal measuring means for the identifying the rf signal frequency corresponding to the maximum rf signal propagated from the sweep generator to the rf coil;

a frequency converter coupled to the response frequency identifier means for generating a current signal proportional to the frequency corresponding to the maximum rf signal propagated from the sweep generator to the rf coil;

a means for connecting the frequency converter to the auxiliary coil to change the current of the auxiliary coil and thereby change the auxiliary magnetic field generated by the auxiliary coil.

5. The apparatus of claim 4 further comprising an imaging electronics system coupled to the output of the frequency identifier means for receiving magnetic resonance response signals of the frequency of the maximum rf signal and for applying an imaging rf signal to the rf coil at the frequency of the maximum rf signal propagated from the sweep generator.

\* \* \* \* \*